United States Patent
Ngo et al.

(10) Patent No.: US 9,998,111 B2
(45) Date of Patent: Jun. 12, 2018

(54) POWER SWITCH DRIVERS WITH EQUALIZERS FOR PARALLELED SWITCHES

(71) Applicant: Virginia Tech Intellectual Properties, Inc., Blacksburg, VA (US)

(72) Inventors: Khai Ngo, Blacksburg, VA (US); Lujie Zhang, Blacksburg, VA (US); Zichen Miao, Blacksburg, VA (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 0 days. days.

(21) Appl. No.: 15/280,319

(22) Filed: Sep. 29, 2016

(65) Prior Publication Data
US 2017/0179944 A1    Jun. 22, 2017

Related U.S. Application Data

(60) Provisional application No. 62/268,230, filed on Dec. 16, 2015.

(51) Int. Cl.
*H03K 3/00* (2006.01)
*H03K 17/16* (2006.01)
*H03K 17/14* (2006.01)

(52) U.S. Cl.
CPC ......... *H03K 17/165* (2013.01); *H03K 17/145* (2013.01)

(58) Field of Classification Search
CPC .......................... H03K 17/165; H03K 17/145
See application file for complete search history.

(56) References Cited

U.S. PATENT DOCUMENTS 9,083,333 B2 * 7/2015 Kanie .................... H02M 1/32

* cited by examiner

*Primary Examiner* — Kenneth B Wells
(74) *Attorney, Agent, or Firm* — Whitham, Curtis & Cook, P.C.

(57) ABSTRACT

Capacitors connected between gate terminals of a plurality of parallel-connected power transistors are charged and discharged in each switching cycle to provide a plurality of power transistor control waveforms from a single gate driver waveform that equalize power losses/temperatures or steady-state currents among the plurality of power transistors. The capacitors are charged to different voltages by diverting current from one transistor driver by disabling another power transistor driver at different respective times in response to measured transient or steady state current or temperature or other operational parameter.

20 Claims, 19 Drawing Sheets

With DEPS (Delta type)

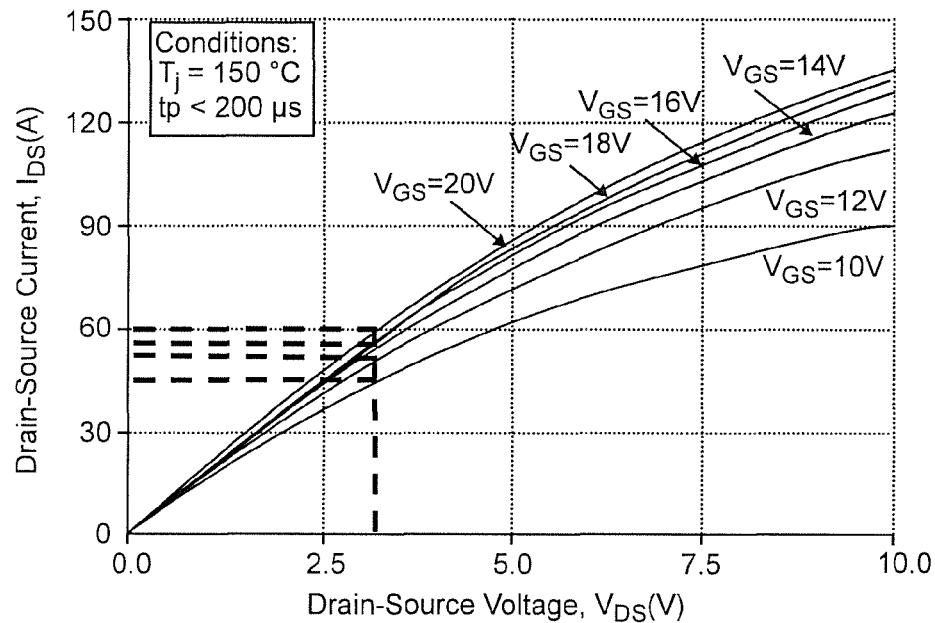
Output Characteristics of SiC MOSFET
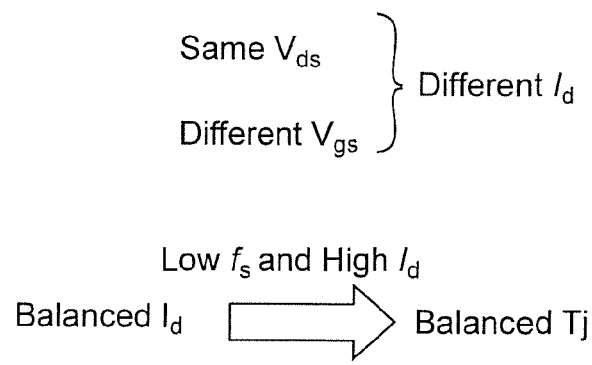
*Figure 1C*
Related Art

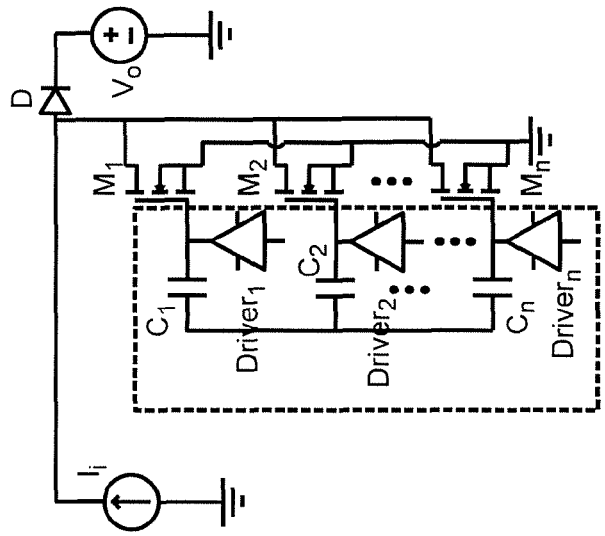
*Figure 6C* With DEPS (Y type)
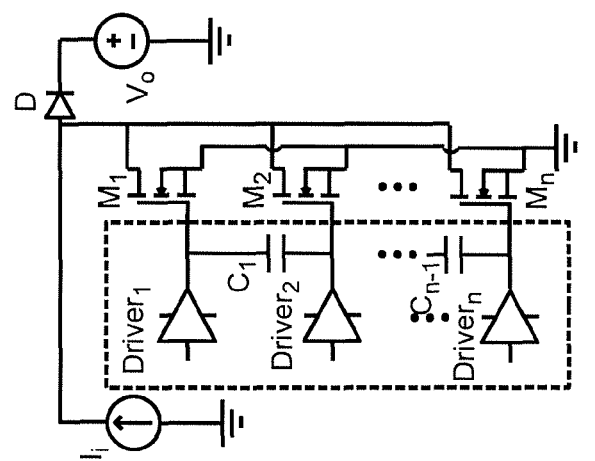
*Figure 6B* With DEPS (Delta type)
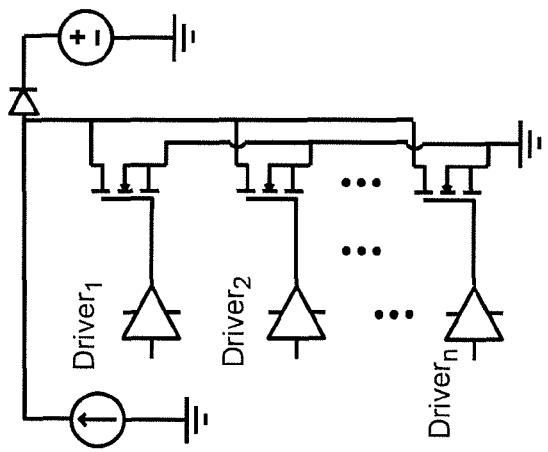
*Figure 6A* Without DEPS Working Principle of DEPS (Delta Type)

M1: $R_{ds(on)}$ = 26 mΩ, Vth = 2.1 V

M2: $R_{ds(on)}$ = 32 mΩ, Vth = 2.7 V

➡ $V_{g1}$ should be smaller than $V_{g2}$

POWER SWITCH DRIVERS WITH EQUALIZERS FOR PARALLELED SWITCHES

CROSS-REFERENCE TO RELATED APPLICATIONS

This application claims benefit of priority of U.S. Provisional Application 62/268,230, filed Dec. 16, 2015, which is hereby incorporated by reference in its entirety.

FIELD OF THE INVENTION

The present invention generally relates to switching arrangements for control of large currents and, more particularly, to switching arrangements in which a plurality of switches are connected in parallel to obtain a higher current capacity than the current rating of any individual switch.

BACKGROUND OF THE INVENTION

Semiconductor devices capable of controlling large currents have been used for many years in numerous devices and applications such as control of high power generators, power sources and power distribution grid connections, air conditioning and heating installations, electric motor control and power converters for large electrical loads such as battery chargers for electrically powered vehicles. However, many semiconductor devices such as silicon carbide (SiC) MOSFETs have low current ratings as an incident of their manufacturing processes. On the other hand, semiconductor switches having especially high current ratings may command a premium price or present some other performance drawback relative to transistors having lower current ratings. Therefore it is common to construct switching arrangements with a plurality of semiconductor switches having lower current ratings connected in parallel to obtain a high current capability and rating for the overall switching arrangement.

Simplicity and low numbers of electrical and electronic devices are also important to economical manufacture and high power density of such switching arrangements and it is generally preferred to drive the switches in parallel with a single gate driver circuit that applies the same currents and voltages to control electrodes of all of the paralleled switches in common. However, discrete switches will inevitably exhibit some mismatch among such parameters as ON-resistances, causing conduction losses, and threshold voltages, causing switching losses, and suffer higher junction temperatures and shorter reliably usable life.

While this problem with use of a plurality of parallel connected power switches and the need for equalization of performance of parallel-connected power switches has been long-recognized, prior efforts to approach equalization of performance has required separate control circuits for each of the parallel-connected power switches to develop separate drive waveforms for the respective power switches. Further, such known approaches exhibit significant disadvantages and have not provided a complete or robust solution to the problem, even at the cost of substantial complexity and expense. Moreover, known approaches to this problem are generally specific to a particular number of parallel-connected power switches and increase greatly in complexity and cost with increases in the number of power switches connected in parallel.

SUMMARY OF THE INVENTION

It is therefore an object of the present invention to provide a driving arrangement for a plurality of parallel-connected power switches that is capable of automatically adjusting the control waveform for each respective power switch from a single control or gate drive waveform that automatically reduces or eliminates effects of temperature imbalance and dynamic or steady-state current imbalance caused by mismatches in power switch electrical parameters.

It is another object of the present invention to provide a simple and inexpensive arrangement for equalizing electrical performance of a plurality of parallel-connected power switches having imbalanced electrical parameters within a very small tolerance.

It is a further object of the invention to provide an arrangement for equalizing electrical performance of a plurality of parallel-connected power switches that can be readily expanded to any arbitrary number of power switches.

In order to accomplish these and other objects of the invention, a power switch is provided comprising a plurality of power transistors, each having conduction terminals connected in parallel and a plurality of capacitors connected between control terminals of the plurality of power transistors, a power transistor driver for each of the power transistors, a gate driver for controlling the power transistor drivers, a plurality of sensors for sensing an operational parameter of each power transistor, and a circuit responsive to each of the plurality of sensors for disabling respective ones of the power transistor drivers to assume a high impedance state such that respective ones of the plurality of capacitors are charged to a voltage that equalizes the operational parameter of each of the plurality of power transistors from another of the power transistor drivers.

In accordance with another aspect of the invention, apparatus is provided for equalizing an operational parameter in a plurality of power transistors, each having conduction terminals connected in parallel, comprising a plurality of capacitors connected between control terminals of the plurality of power transistors, a power transistor driver for each of the power transistors, a gate driver for controlling the power transistor drivers, a plurality of sensors for sensing an operational parameter of each the power transistor, and a circuit responsive to each of the plurality of sensors for disabling respective ones of the power transistor drivers to assume a high impedance state such that respective ones of the plurality of capacitors are charged to a voltage that equalizes the operational parameter of each of the plurality of power transistors from another of the power transistor drivers.

In accordance with a further aspect of the invention, a method of equalizing power losses in each of a plurality of power transistors having conduction terminals connected in parallel is provided comprising steps of charging a gate terminal of each power transistor with an output of a driver circuit having a high impedance output when disabled, diverting current from said output of said driver circuit to a capacitor connected between a gate terminal of one power transistor by disabling a driver circuit of another power transistor to which said capacitor is also connected, and determining a time to disable said driver circuit of said another power transistor such that charge on said capacitor alters conduction of said another transistor.

BRIEF DESCRIPTION OF THE DRAWINGS

The foregoing and other objects, aspects and advantages will be better understood from the following detailed description of a preferred embodiment of the invention with reference to the drawings, in which:

FIG. 1C is a graphical illustration of variation in drain-source current as a function of drain-source voltage of a power MOSFET for different values of gate-source voltage, FIGS. 6A, 6B and 6C are schematic illustrations of a power switch arrangement without the invention, with a delta-type embodiment of the invention and a Y-type embodiment of the invention.

DETAILED DESCRIPTION OF A PREFERRED EMBODIMENT OF THE INVENTION

Figure 1A:
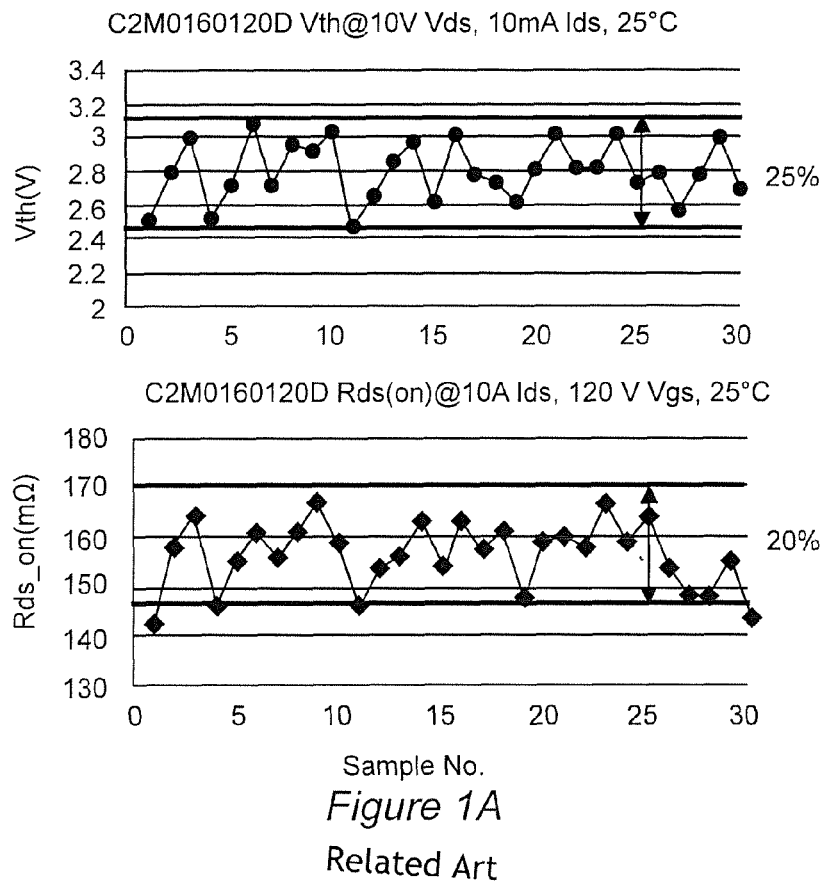
FIG. 1A graphically illustrates variation in threshold voltage and ON-resistance of a random sampling of as-manufactured and commercially available silicon carbide (SiC) power MOSFETS.
Figure 1B:
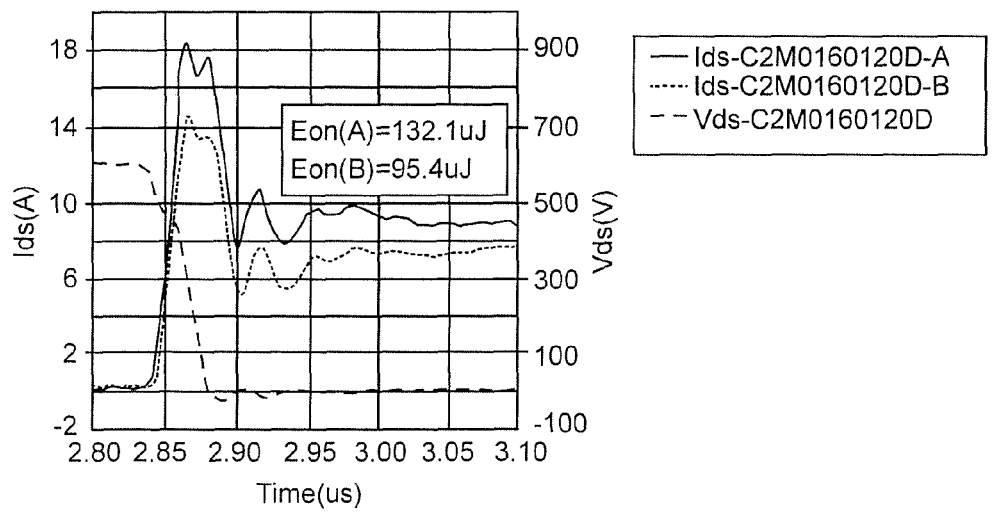
FIG. 1B is a graphical comparison of the difference in dynamic current at a turn-on transient of two SiC MOSFETs having different threshold voltages and ON-resistances.

Referring now to the drawings, and more particularly to FIG. 1A, there is shown a graphical depiction of the variation of threshold voltage and ON-resistance ($R_{ds}$) of a random sampling of commercially available silicon carbide (SiC) power MOSFETs, as manufactured. While the individual power MOSFETs are numbered 1-30, the numbering does not reflect any order of manufacture or any other relationship between the individual devices but is applied merely for device identification and may be regarded as randomly applied as well. Therefore, the lines between the values for individual devices are applied merely for visibility and no trend or relationship between the depicted values is intended. However, it should be noted from the two graphs that there is a general correlation between threshold voltage, $V_{th}$ and $R_{ds}$ of individual devices. That is, a high or low ON-resistance, $R_{ds}$, generally correlates with a high or low $V_{th}$ and vice-versa but the values are not proportional. Otherwise, FIG. 1A indicates that a variation in $V_{th}$ of 25% and a variation in $R_{ds}$ of 20% is typical for power transistor switch devices and SiC MOSFETs in particular. The effects of the $V_{th}$ differences at a turn-on switching transient is shown in FIG. 1B in which the current waveforms are of different peak amplitude at the switching transient (as the conduction channel voltage, $V_{as}$, falls to near-zero and ON-resistance goes to a low value) and settle to different steady-state values depending on ON-resistance. The current values depicted in FIG. 1B will also vary with drain-source voltage and gate-source voltage as shown in FIG. 1C but will remain substantially proportional to the voltages shown in FIG. 1B.

It can also be clearly seen from FIG. 1B that the difference in steady-state current is significant and will result in unequal temperature rise and heat dissipation requirements for respective power switches. The effect is even greater for increased switching frequencies since the current difference is greater during the transient than at steady-state and reflects increased switching losses which must be dissipated as heat. Accordingly, the importance of providing equalization of the electrical characteristics of the respective parallel-connected power switches is abundantly evident and a number of approaches to equalization are known; some of which will now be described. It is to be understood that the approaches described below are not exhaustive and that they have been chosen as exemplary of the breadth of known approaches as well as the breadth and range of the deficiencies thereof.

It is well-known that power dissipation of a transistor used as a switch principally comprises switching losses and conduction losses. Energy dissipation of a transistor used as a switch is high when, in a state intermediate between and ON-state and an OFF-state, significant current flows through a significant resistance. That is, during a portion of the switching transient, $V_{gs}$ will be higher than $V_{th}$ and transconductance will be proportional to the difference between those voltages. Thus, switches with lower $V_{th}$ will exhibit higher transconductance and conduct larger currents. Especially with MOSFETs where the gate presents a significant capacitance and the gate terminal (and the circuit providing a driver output to it) will have some finite resistance establishing an RC time constant for the gate current rise and fall times to charge and discharge the gate capacitor, while the gate signal transition may be nearly instantaneous, the gate voltage, $V_{gs}$, transition time will thus have a significant duration due to the RC time constant over which the power consumed by the transistor will be significantly increased. Thus, instantaneous switching or transient losses are greater than instantaneous conduction or steady-state losses in transistors used as switches but the relative magnitudes of each of these power loss components depends on their relative durations in each switching cycle.

One known approach to equalization of transistor power consumption among parallel-connected power transistors exploits these characteristics of MOSFETs to equalize (but not necessarily minimize) the turn-on and turn-off transient durations between the parallel-connected switches. However, this technique cannot balance steady-state or overall/total power losses in the respective transistors.

Figure 2A:
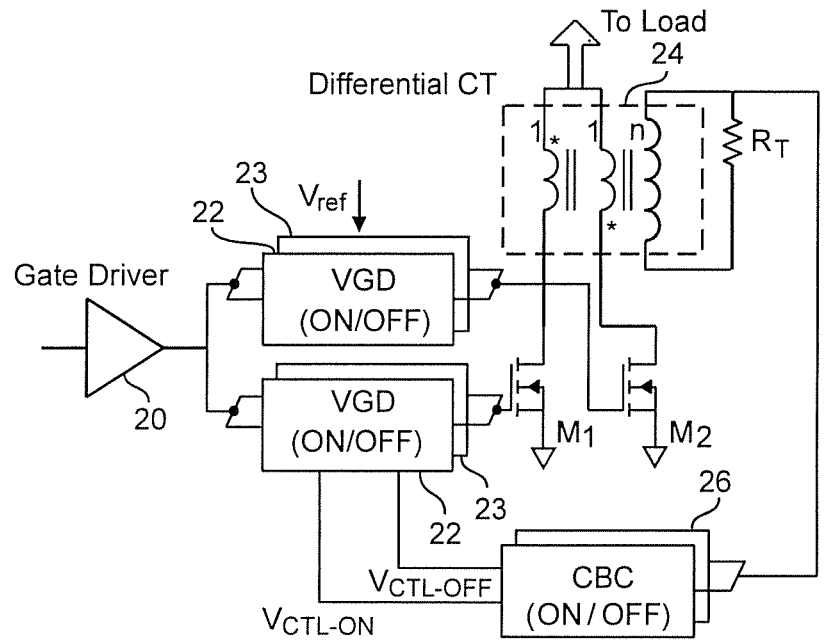
FIGS. 2A, 2B, 2C, 2D and 2E are schematic diagrams illustrating an approach to power switch equalization using delay time.

Referring now to FIG. 2A, a schematic diagram illustrating equalization of control transients is shown. As alluded to above, a gate driver 20 is provided to provide a control waveform for the overall power switch arrangement in which the parallel-connected switches M1 and M2 are limited to two, for clarity. Each of the power switches M1, M2 is provided with driver circuit networks 22, 23, illustrated in greater detail in FIGS. 2B-2D, to develop the gate-drain voltage $V_{gd}$ applied to a respective power transistor gate. (Driver circuit networks 22, 23 and other circuits or transistors directly connected to respective transistor gates are sometimes referred to as "sub-drivers" or simply as "drivers" but it is important in the following discussion of other approaches to transistor performance equalization, particularly in regard to the present invention, to maintain the distinction between such "drivers" and the gate driver(s) such as gate driver 20 providing overall control of the power switch arrangement.) Current difference for the respective transistors is sensed by a differential current transformer 24 and an output thereof fed back to the driver networks 22, 23 through a feedback loop 25 including transient compensator or current balancing controller (CBC) 26, illustrated in greater detail in FIG. 2E.

Figure 2B:
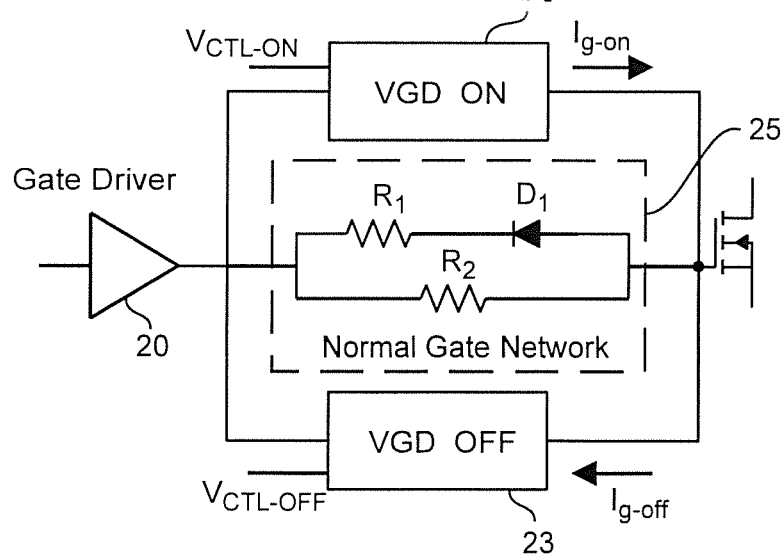

Referring now to FIG. 2B, it will be appreciated that FIG. 2B illustrates a portion of FIG. 2A between gate driver 20 and switch $M_{1/2}$ (e.g. a switch corresponding to either switch M1 or M2) but omits the other switch, the differential current transformer 24 and the feedback loop. As alluded to above, the gate of the switch $M_{1/2}$ presents an electrical capacitance that is charged or discharged through a finite resistance when the state of the switch is changed. The charging or discharging (and change in transconductance) may not occur at the same rate in different transistors (and their respective driver circuits) and the gate driver output voltage (approximating the voltage on the gate/control electrode) can be modeled in accordance with the expected charging or discharging rate (or the transient duration compensated) by a network such as that shown within dashed line 25 of FIG. 2B. This network has two parallel branches, each including a resistance R1, R2 with a diode connected in series with one of the resistances, in this case, R1. Therefore, while R2 provides a current path to the gate of the switch for both turn-on and turn-off transients, an additional current path will exist for either the turn-on or turn-off transient; reducing the (in this case, turn-off) transient duration. As further shown in FIG. 2B, additional compensation of the turn-on and turn-off transient durations can be provided by the driver circuit networks 22, 23, depicted in FIGS. 2C and 2D, respectively.

Figure 2C:
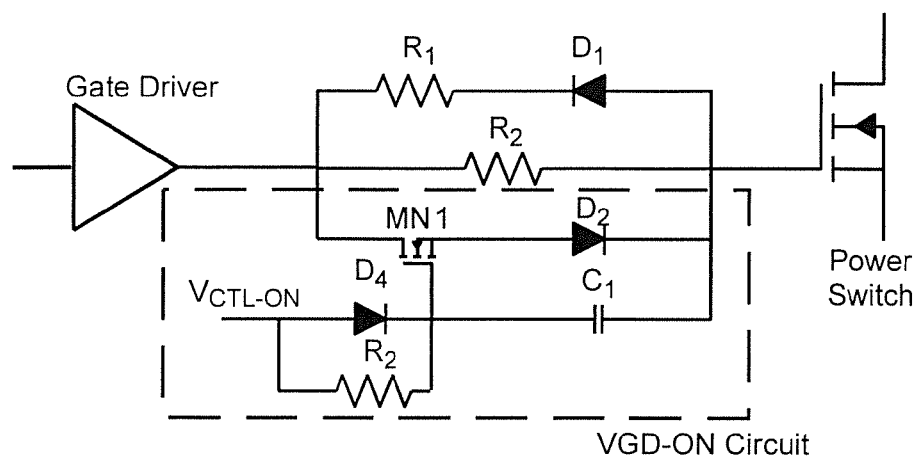
Figure 2D:
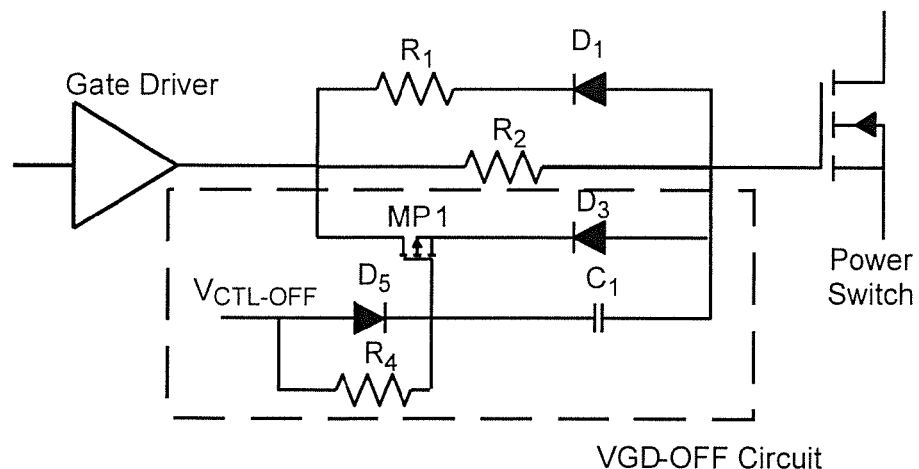

In both FIGS. 2C and 2D, it will be recognized that the normal gate network of FIG. 2B is replicated outside the dashed rectangle and the circuit inside the dashed rectangle provides an additional charging or discharging path for the power transistor gate. These additional circuits differ only by the input voltage and the polarity of diodes D2 and D3 and voltages input to diodes D4 and D5 which provide additional charging and discharging paths, respectively.

Figure 2E:
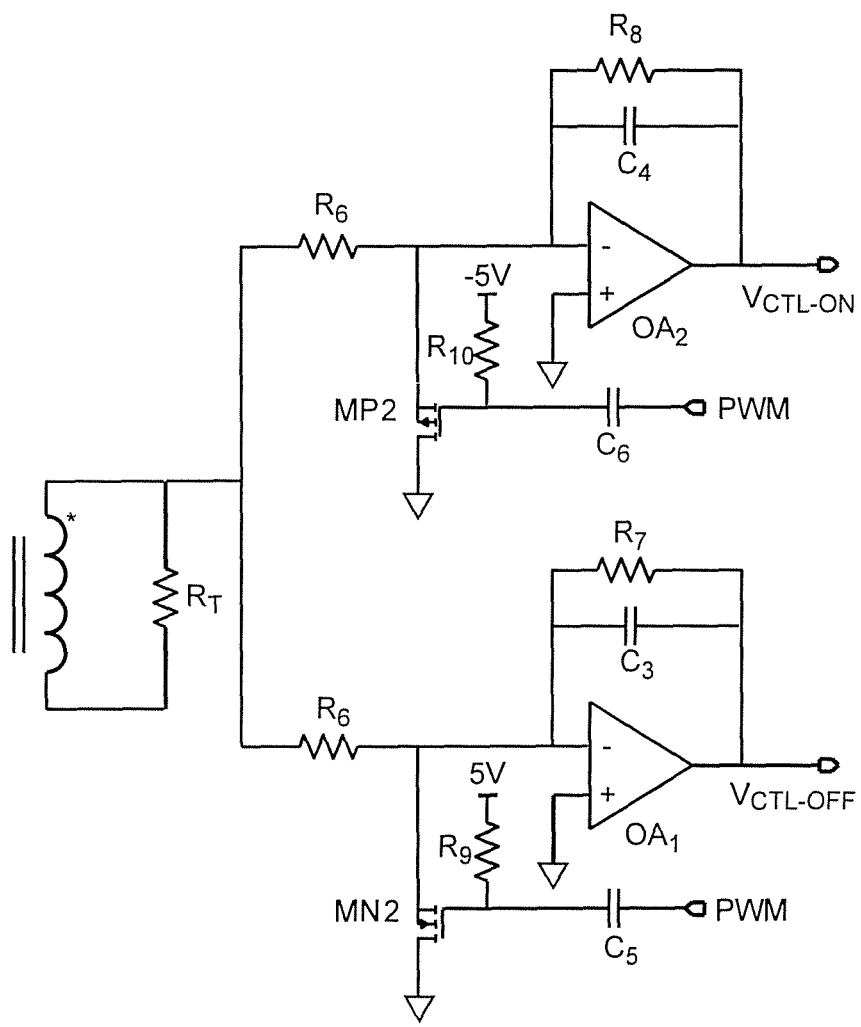

Referring now to FIG. 2E, it will be recognized that the sensing coil of the differential current transformer included in FIG. 2A is shown as an input to two operational amplifier circuits, both of which include a feedback circuit including a series capacitance to cause operation as an integrator. The input of each of these circuits can be pulled to ground by transistors MN2 or MP2, respectively, in response to turn-on periods or turn-off periods (e.g. respective switching transitions of a pulse width modulated signal, PWM, which facilitates adjustment of the occurrence time of the delay to be applied at the correct times) coupled through respective capacitors C5 and C6 which are normally charged to a bias voltage through resistors R9 and R10, respectively. Thus, compensation is normally off and functions only at the beginning of a turn-on or turn-off transient. The output of the differential current transformer will be amplified and integrated to build up either $V_{CTL\text{-}ON}$ or $V_{CTL\text{-}OFF}$ to be input to networks 22 or 23, respectively, to provide an additional charge/discharge path for the power transistor gate that will tend to equalize the transient durations between or among the power transistors in accordance with the difference in current through M1 and M2.

This technique has the advantage that measurement of the current difference can be achieved fairly economically with a single current differential transformer device 24 and the gate delay to each device may be separately controlled for both the turn-on and turn-off periods and is effective only to balance dynamic current and switching losses to provide some reduction in total losses. However, as alluded to above, this approach does not even attempt to equalize steady-state current or balance power among the power transistors and, moreover, is difficult to extend to more than two power transistors in view of the complexity and number of electrical and electronic elements in the circuits of FIGS. 2C-2E. Also, those skilled in the art will recognize that the circuits of FIGS. 2C and 2D and, to some extent, 2E are essentially circuits which include an RC time constant delay at switching transients which causes difficulty and complexity in obtaining high speed or frequency operation while closely controlling the delay period.

Figure 3A:
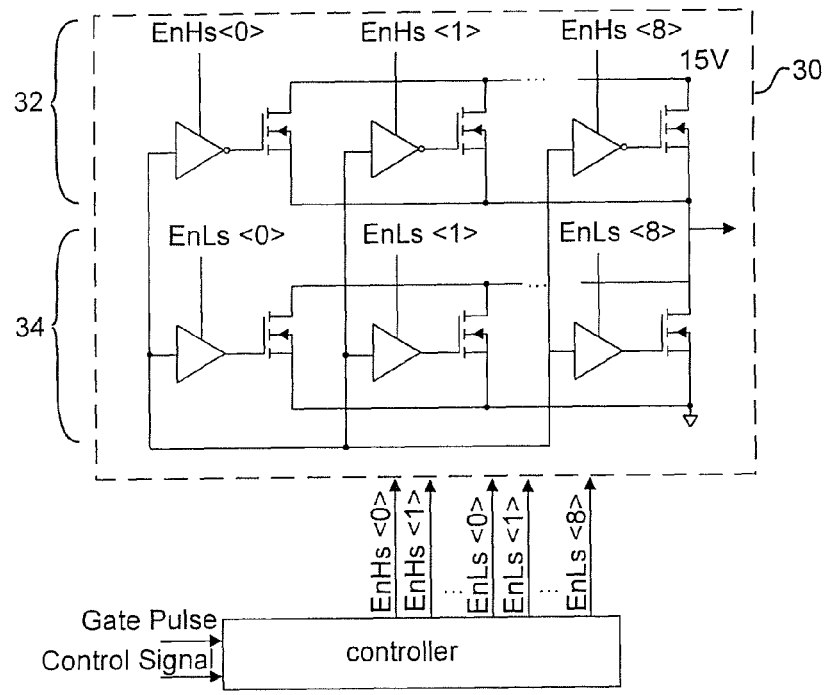
FIGS. 3A, 3B and 3C are schematic diagrams and waveforms illustrating an approach to equalization with changing gate resistance.
Figure 3B:
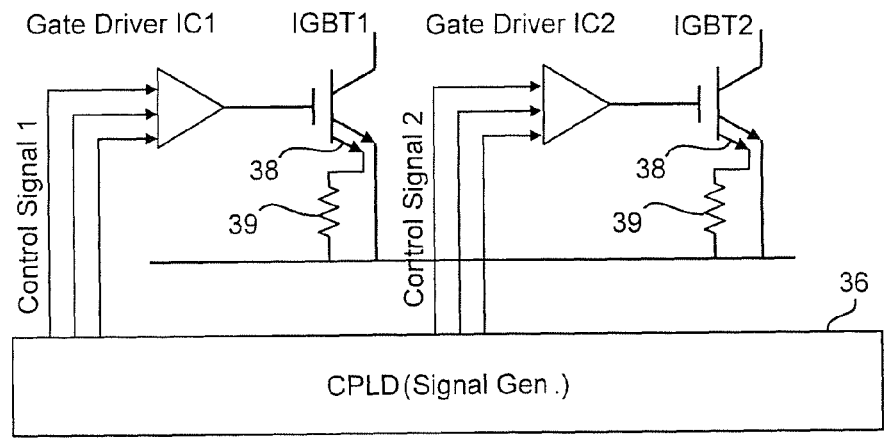
Figure 3C:
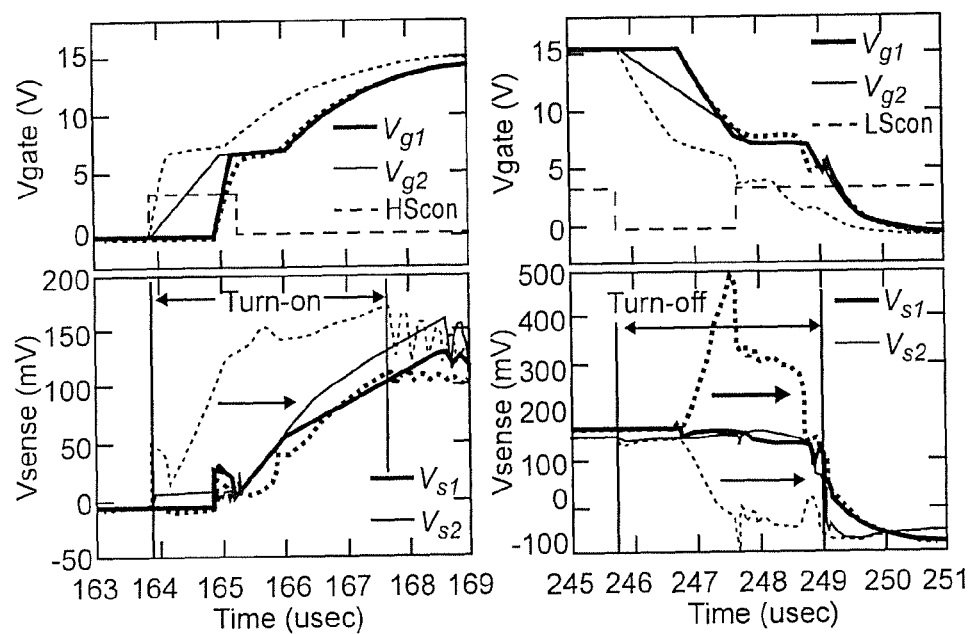

Referring now to FIGS. 3A-3C another known approach to current equalization will now be explained. This approach is somewhat similar to the approach discussed above in connection with FIGS. 2A-2E but can be implemented more simply and can be included (e.g. integrated) within a gate driver circuit such as gate driver 20 or simply connected in series with the power transistor gate connection. Basically, as shown in FIG. 3A, a variable resistance circuit 30 is provided that comprises an array of parallel-connected MOSFETs, each MOSFET having an ON-resistance that may or may not be substantially equal to each other and connected in two groups; one group for providing charging current to the power transistor control electrode and the other group for drawing discharge current from the power transistor control electrode. Particular MOSFETs are made conductive to provide parallel current paths during the switching control transients by controller 36 which has the advantage of being susceptible to standardization and thus implemented economically in potentially large numbers as application specific integrated circuits (ASICs) which may include the MOSFET arrays in the same complex programmable logic device (CPLD) element or in the gate driver itself. Current sensing is also simplified somewhat, especially if insulated gate bipolar transistors (IGETs) having internal current sensors are employed as power switches since such devices provide an additional emitter connection 38 which can be connected to a current sensing resistor 39. Thus the gate driver can be programmed to provide a controllable output resistance in series with the power transistor gate terminal as illustrated in FIG. 3B to control transient duration as illustrated in FIG. 3C. Therefore, this approach to equalization has the advantage that high frequency digital logic and/or complicated time delay circuitry is not required. However, as with the previously discussed approach, this approach does not attempt to achieve steady-state power equalization but affects only dynamic current and switching losses in a manner similar to the previously described approach. Further, while ASICs may achieve some economies of implementation, a controller 36 or gate driver integrated circuit is required for each parallel-connected power transistor which increases costs.

Figure 4A:
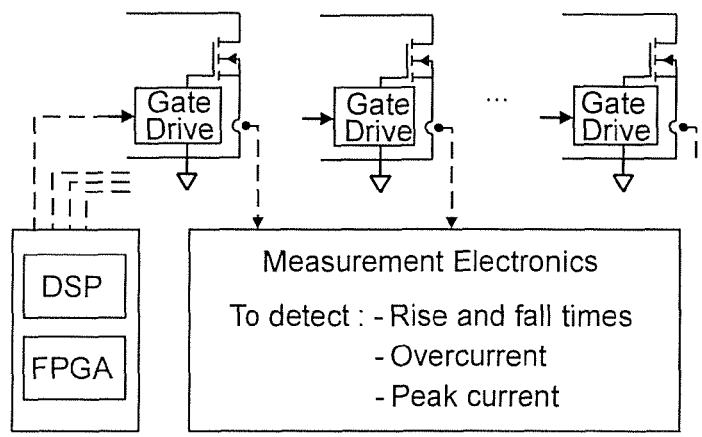
FIGS. 4A, 4B and 4C illustrate an approach to equalization using digital control.
Figure 4B:
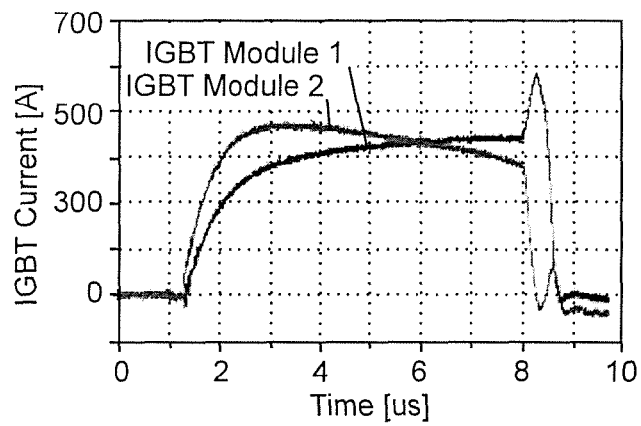
Figure 4C:
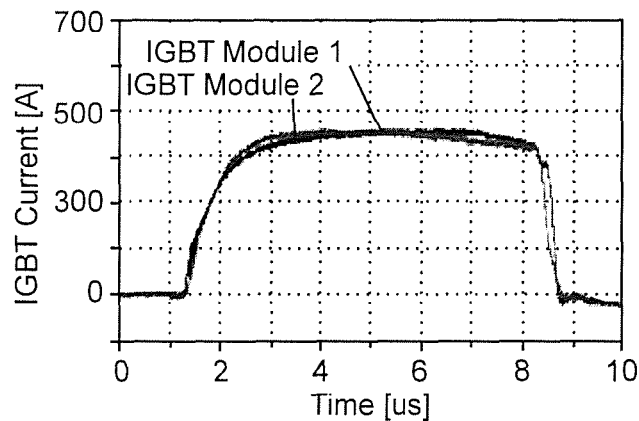

Another but far more effective approach is use of digital control as illustrated in FIGS. 4A-4C. As shown in FIG. 4A, current in each transistor can be sensed using, for example, a Rowgowski coil, preferably formed on or embedded in a printed circuit board (PCB) or substrate to measure parameters such as rise and fall transient times, overcurrent conditions, peak current, steady-state current, and other conditions involving current. Other sensors can be provided for sensing other conditions such as temperature and/or any other parameter for which control is desired. These parameters are then used to compute various control parameters of the gate driver output signal through use of a field programmable gate array (FPGA) and/or digital signal processor (DSP) to allow extremely close matching of power transistor performance as is evident from a comparison of FIGS. 4B (illustrating current waveforms for two discrete IGBT devices without equalization) and 4C (illustrating close correspondence of current waveforms of the same two discrete devices achieved through digital control. Thus, while power loss equalization can be achieved at all times including both transient and steady-state conditions using this technique, digital control is prohibitively costly for all but the most critical applications and, in any case, is constrained by the performance of the controller, especially at the switching frequencies generally preferred.

As alluded to above in connection with FIG. 1C which illustrates output characteristics of a SiC MOSFET (which is considered to be exemplary of the relevant corresponding properties of other types of power transistors), it can be seen that differences in the gate-source voltage, $V_{GS}$, can produce different drain-source currents, $I_{DS}$, for the same drain-source voltage, $V_{DS}$; a characteristic exploited by the present invention to provide the meritorious effect of power equalization within a very close tolerance in a very simple and economical manner. For purposes of conveying an understanding of the invention sufficient for its successful practice by those skilled in the art, a power switch comprising two parallel-connected power transistors can be simulated as shown in FIGS. 5A and 5B which are identical but for the value of the equalization voltage, $V_c$, which is zero in FIG. 5A (e.g. without equalization) and nominally two volts in FIG. 5B.

Figure 5A:
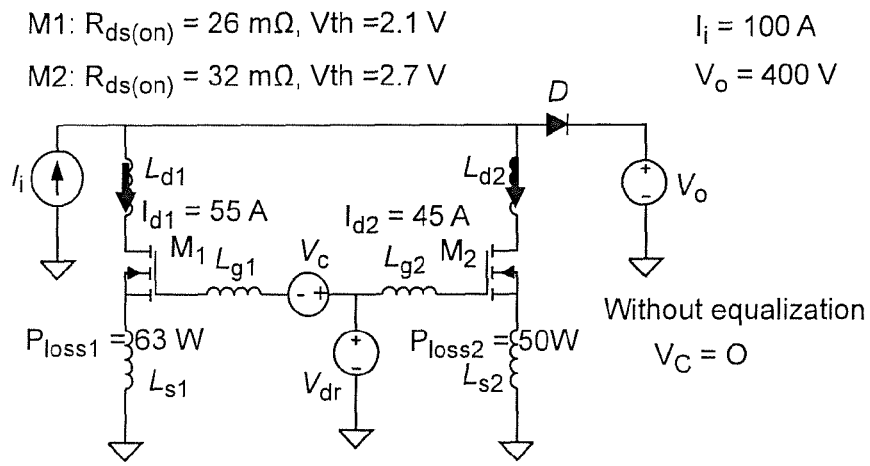
FIGS. 5A and 5B are schematic illustrations of power switch arrangements using plural parallel-connected power switches without and with the invention, respectively.
Figure 5B:
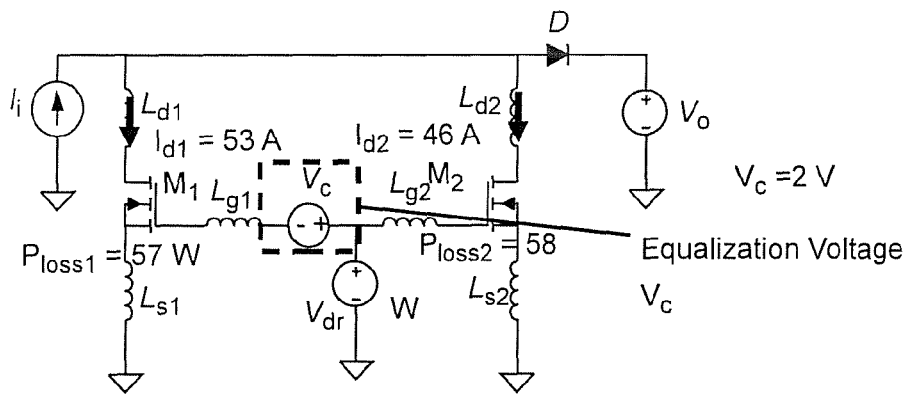

While the topology of this simulation as depicted in these Figures might not be immediately recognized, it is, in actuality, a schematic of a boost converter having two transistors connected in parallel but it should be understood that the boost converter topology is chosen for purposes of clarity and simplicity in FIGS. 5A and 5B and that the invention is fully applicable to power converters of any type or topology or any other power switching application. Similarly, for purposes of facilitating an understanding of the invention, the input power source is depicted as a current source, $I_i$, and the output or load is depicted as a voltage source, $V_o$. The control input or gate driver is also depicted as a voltage source, $V_{dr}$. The parasitic inductance of the gate connections are modeled as $L_{g1}$ and $L_{g2}$. Switches M1 and M2 in this model are assumed to have an ON-resistance, $R_{ds(on)}$, of 28 mΩ and 32 mΩ, respectively, and threshold voltages, $V_{th}$, of 2.1V and 2.7V, respectively, for which an equalization voltage of two volts will produce substantially compensated currents, $I_{d1}$=45 A, $I_{d2}$=55 A, totaling 100 A at 400V to a load in this particular instance with substantially equalized power of 57 and 58 Watts, respectively, (or substantially equalized temperature) as compared with 63 and 50 Watts, respectively, without equalization. Other goals such as balancing steady-state currents can be achieved with other equalization voltages.

However, $R_{ds(on)}$ and $V_{th}$ can vary due to aging or operational conditions such as temperature as well as the manufacturing variation discussed above. While it might be possible to derive a voltage that equalizes currents in a given or small number of parallel-connected transistors used in a high-current switch, that voltage would only be accurate for a particular combination of operational parameter values. Moreover, setting a fixed voltage offset for each power transistor of a high-current switch is not practical for an economical manufacturing environment, particularly when the number of parallel-connected power transistors becomes large, and does not yield optimum performance over the full range of possible operating conditions. Furthermore, such a source of offset voltage must necessarily be floating and thus is very difficult and complex to design.

Accordingly, it is an important aspect of the present invention to provide an arrangement for automatically and adaptively developing a correct equalization voltage for the current operating conditions of the high-current switch during operation. Thus, it is preferred to embody the equalization voltage source as a capacitor which can be charged and/or discharged to the appropriate voltage to achieve equalization of current, temperature or both.

In this regard, it should be understood that the model in accordance with the invention shown in FIG. 5B is simplified by limiting the number of parallel-connected power switches to two. In such a limited case, only one equalization voltage source is required. When more than two power transistors are connected in parallel, additional equalization voltage sources are required which, embodied as capacitors, can be connected in either a so-called delta configuration illustrated in FIG. 6B or a so-called Y configuration shown in FIG. 6C. (The Y configuration of capacitors corresponds to a similarly denominated connection of power sources or loads in a multi-phase system but the delta configuration allows omission of one capacitor compared to the connection of power sources/loads in a delta-connected multi-phase system.) In the case of only two parallel-connected power transistors, delta and Y connections are substantially identical although providing two equalization voltage sources would nominally be specific to a Y connection.

That is, FIG. 6A illustrates an arrangement of an arbitrary number of parallel-connected power switches without equalization voltage sources for comparison. Basically, in a delta connection configuration, a capacitor is provided between the gate connections of each two power transistors and the number of capacitors can thus be one capacitor fewer than the number of power transistors in a manner analogous to an equalization voltage source being omitted for power transistor M2 (e.g. in series with $L_{g2}$) in FIG. 5B. It can be appreciated that the model illustrated in FIG. 5B would operate identically if an equalization voltage source were to be provided for each of power transistors M1 and M2. Such a provision would be specific to a Y-connection of an arbitrary number (e.g. two or more) of capacitors, each capacitor being connected between a common node and the gate terminal of a respective transistor of an arbitrary number of power transistors. In other words, while FIG. 5B can be understood as illustrating either a delta or Y connection of capacitors when only two power transistors are employed, a Y connection (if generalized to more than two power transistors) would also include a capacitor in series with M2 which can be omitted in a generalized delta connection.

Figure 7A:
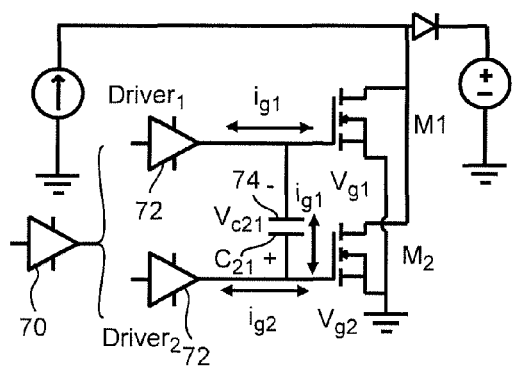
FIGS. 7A and 7B illustrate the working principle of the invention.
Figure 7B:
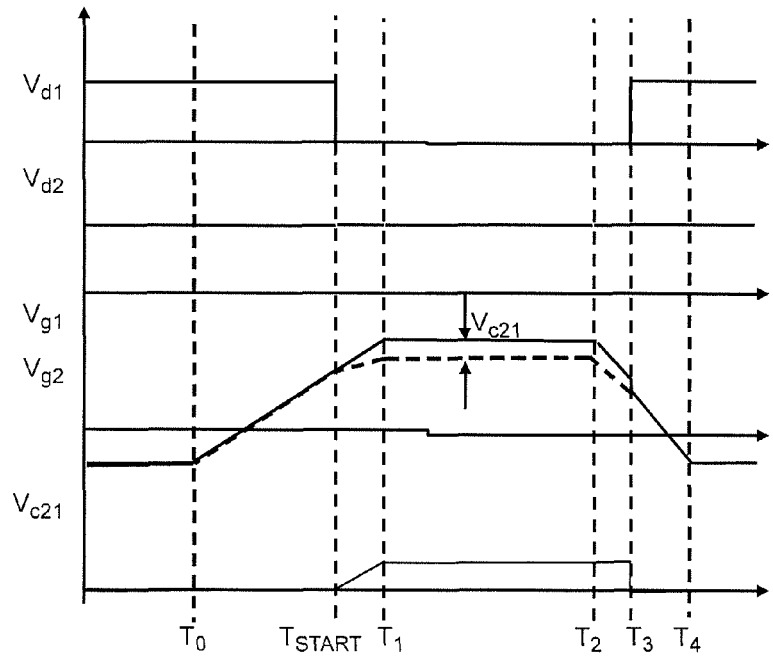

Referring now to FIGS. 7A and 7B, the basic operating principle of the invention will now be described. As pointed out above, it is important to distinguish between the signals output from the gate driver 70, of which there would ideally be only one for overall control of the power switch arrangement and the power transistor sub-drivers or, simply, drivers 72, one of which is provided for each power transistor to charge and discharge with capacitive gate of each respective power transistor. Drivers 72 may simply be individual MOSFETs or other type of transistor connected to a transistor drive voltage source (e.g. +20 volts or −5 volts depending on the output of the gate driver 70) sufficient to drive a power transistor to achieve low ON-resistance or substantially conductive state when the drivers 72 are conductive and to present a high impedance in an OFF state.

Essentially, the gate driver 70 controls the voltage that the drivers 72 apply to the gate terminals of the respective power transistors. Drivers 72 are initially in a low impedance, conductive state and apply a low voltage (e.g. −5 volts) from the gate driver 70 to the power transistors. When gate driver 70 switches to a high voltage output, drivers 72 concurrently begin charging the gates of the power transistors, during which the same voltage will be applied to both terminals of capacitor 74 and no charging of capacitor 74 will occur since $I_{g1}$ and $I_{g2}$ will be substantially the same and the power transistor gates will be at approximately the same voltage. However, due to differences in switching thresholds and ON-resistance of the power transistors (even though the power transistors will not yet be fully conductive) the currents and power losses in the respective power transistors may be somewhat different and, over time, will cause differences in temperature of the power transistors.

At some later time, $T_{start}$, during the process of charging the power transistor gates, determined in response to a difference in current, temperature or any other parameter that it may be desirable to equalize, reaching a threshold, the operation of one (or more if more than two power transistors are provided in the high current switch) of the drivers 72 is interrupted, in this case $Driver_1$, causing a high impedance state and causing capacitor 74 to begin charging and supplying $I_{G1}$ to the gate terminal of power transistor M1 at a reduced current, building up a voltage, $V_{c21}$, on capacitor 74, depending on the value of capacitor 74, while charging of the gate terminal of power transistor M2 continues until the gate voltage $V_{gs}$ applied responsive to gate driver 70 (e.g. 20 volts) is reached and no further charging can occur. The voltage to which power transistor M1 is charged will be $V_{c21}$ lower than the high voltage to which M2 is charged since capacitor 74 essentially forms a capacitive voltage divider with the gate capacitance of transistor M1. This difference in gate voltages applied to the power transistor gates can be maintained with the power transistors both turned on and equalized for an arbitrarily long period of time (e.g. between $T_1$ and $T_2$) and will continue for a period of time thereafter (between $T_2$ and $T_3$) as the available charging voltage is reduced in response to the gate driver 70 being turned off.

That is, even though the drivers are of different impedances during this period, the charge on the capacitor will be maintained by the higher voltage on the capacitive gate of the transistor that is charged to a higher voltage. More specifically, when $Driver_1$ is disabled (between $T_{start}$ and $T_3$), $Driver_2$ is connected to two branches: directly to $C_{gs2}$ and to the serial connection of $C_{21}$ and $C_{gs1}$. Thus, when charging stops, $V_{gs2}$ should be at the maximum driver voltage (e.g. 20 volts) and $V_{gs1}$ will be at a lower voltage (e.g. reduced by the voltage built up on $C_{21}$). The difference in impedance of the drivers assures that one driver is functioning and that $c_{gs1}$ and $C_{21}$ effectively in series and the voltage on $C_{21}$ is stable. Then, at time $T_3$, both drivers will become of low voltage, low impedance state and the capacitor $C_{21}$ will be discharged while the voltage on the power transistor gates continues to discharge until complete at time $T_4$, completing a switching cycle and resetting the circuit for another switching cycle.

Figure 8A:
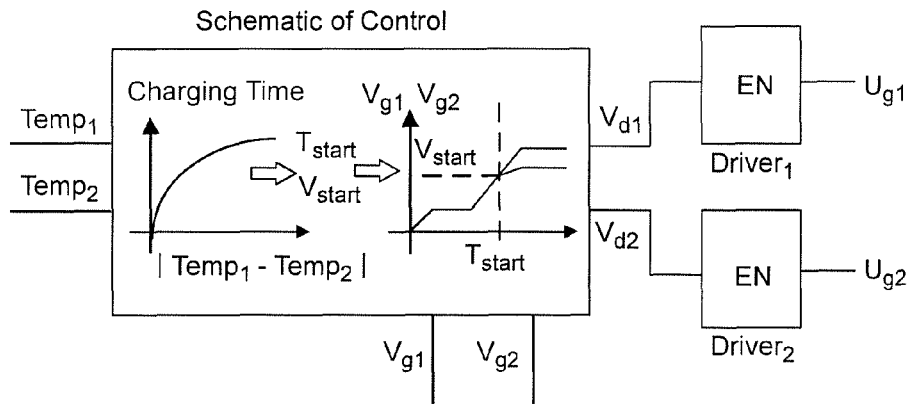
FIGS. 8A, 8B and 8C illustrate an exemplary control law in accordance with the invention.
Figure 8B:
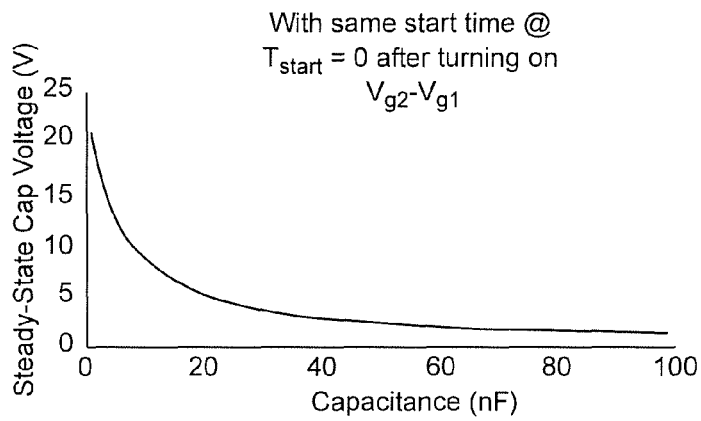
Figure 8C:
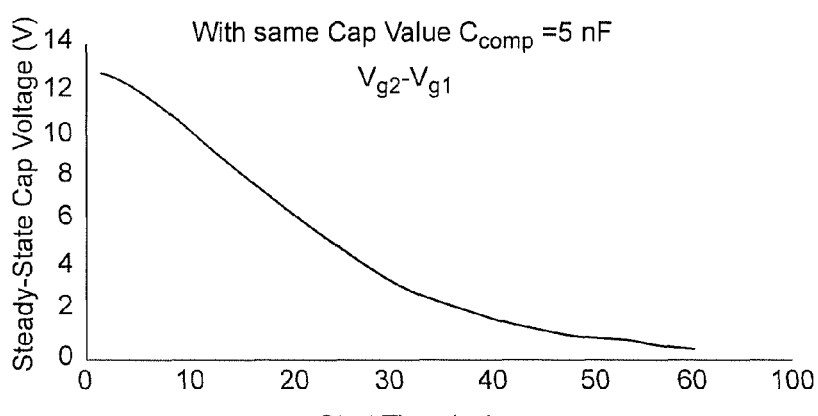

Referring now to FIG. 8A-8C the control law by which the invention operates will now be explained. As alluded to above, any particular operating parameter (e.g. current, temperature or the like) that it may be desired to equalize among parallel-connected power switches can be monitored or measured and a converted to a voltage signal proportional to (or otherwise related as a function of) that parameter. These voltages can then, for example, be compared or the smaller subtracted from the larger to obtain a voltage proportional to the absolute value of the difference in magnitude of the parameter for the respective power transistors of each pair of power transistors. If this difference voltage is applied to a capacitor, the capacitor will be charged over time as a function of the capacitance value of the capacitor. Smaller capacitance values are thus preferred since they require a shorter charging time to reach a given voltage as shown in FIG. 8B and thus provide a more rapid response.

As alluded to above, when two power transistors have the same voltage applied to their respective gate terminals, their conductivity will not always be the same, causing a difference in power loss. Accordingly, to equalize currents or power loss/temperature or the like, it is necessary to determine the required difference in voltages to be developed by charging of the equalization capacitor and, from that voltage, to determine a time during the turn-on process of the power transistors when one of the drivers must be disabled in order to develop the correct $V_{c21}$ to equalize ON-current or ON-resistance of the respective transistors as discussed above and as also illustrated in FIG. 8A. That is, as shown in FIG. 7B, if the gate driver 70 is turned on at time $T_0$, to start charging the power transistor gate or control electrodes, the time $T_{start}$, a short delay thereafter, must be determined such that the needed equalization voltage, $V_{c21}$, can be developed on the equalization or compensation capacitor, $C_{comp}$. This can be accomplished by sensing a difference in conductivity during steady-state operation when the power transistors are fully conductive and any of several techniques can be employed.

Referring now to FIG. 8C (which assumes the time required to fully turn on a power transistor is slightly longer than 60 nsec.), it is seen that, for a given capacitor value (here assumed to be 5 pf) the longer the delay after $T_0$ but prior to the time, $T_{start}$, when one of the power transistor drivers 72 is disabled, the shorter the time that will be available for charging the equalization capacitor and the voltage $V_{c21}$ that will be developed on it will decrease monotonically. This characteristic allows several different approaches to accurately determining or adjusting the $T_{start}$ delay, if any, after $T_0$ as well as determining the power transistor driver 72 to be disabled.

For example, a detection of a steady-state current or temperature difference reaching a threshold will be a good approximation of when $T_{start}$ should occur. That delay can be measured and stored and the $T_{start}$ delay can be adjusted incrementally over several switching cycles. As another example, $T_{start}$ delay values corresponding to detected current differences either at steady state or at a particular time during the turn-on transient can be stored in and retrieved from a look-up table and applied to select an appropriate $T_{start}$ delay to develop an approximately correct $V_{c21}$.

However, since equalization can be performed over several switching cycles (and must be performed over a significant number of switching cycles to equalize slowly changing parameters such as temperature) and conduction characteristics can vary with ambient and operational conditions, it is preferred and much more accurate to make adjustments of $T_{start}$ much in the manner of perturbation optimization. That is, once it is determined which power transistor driver is to be disabled (as will be discussed below), the $T_{start}$ delay can be initially set to be just slightly shorter that the turn-on transient time of the power transistors, resulting in only a very small voltage being developed on the compensation capacitor. If a current imbalance is then detected, the $T_{start}$ delay can be reduced by either a fixed decrement or a decrement approximately proportional to the current imbalance during the next (or any subsequent) switching cycle and the process repeated until the current (or any other parameter) imbalance is reduced to any arbitrary degree or brought within any arbitrary tolerance.

Figure 9A:
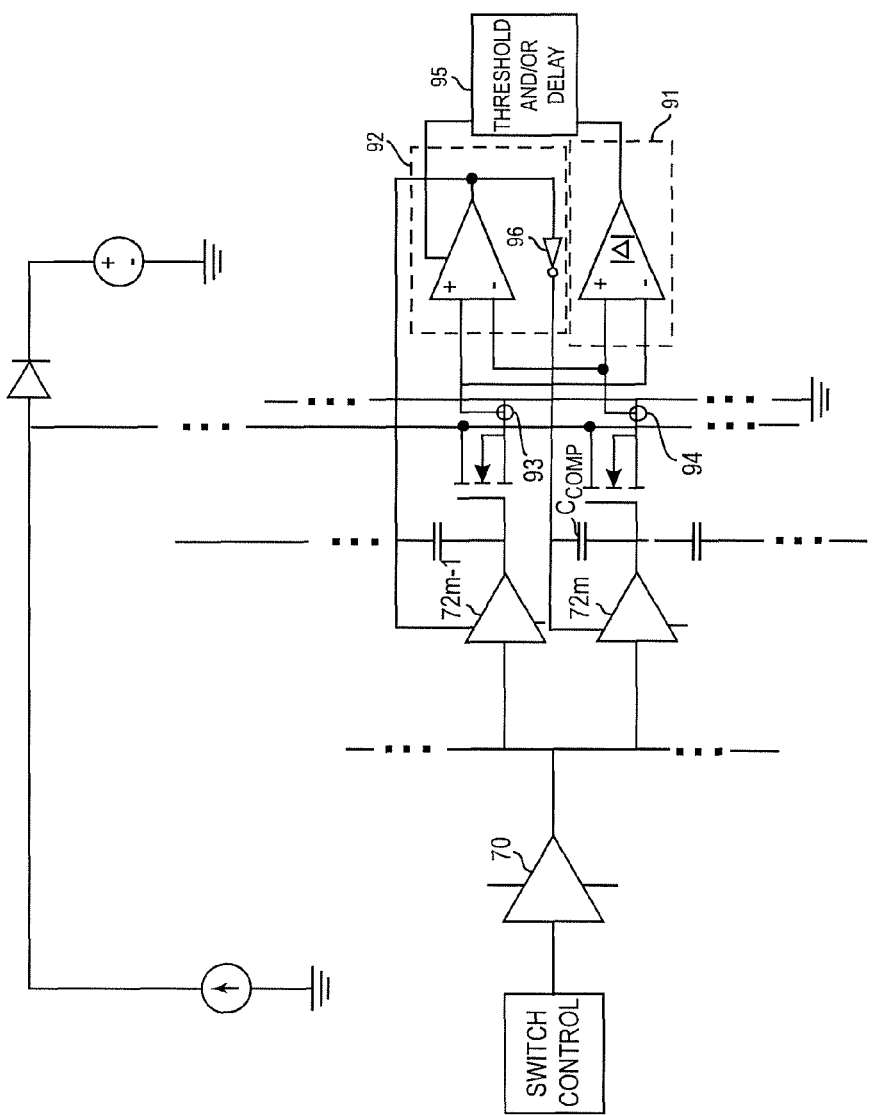
FIG. 9A illustrates an exemplary circuit for achieving the control law of FIGS. 8A-8C, FIGS. 9B and 9C illustrate application of the circuit of FIG. 9A in delta or Y configuration, respectively, to an arbitrary number of parallel-connected power switches.

To summarize the foregoing discussion of FIGS. 7A-8C and to explain how the power transistor driver to be disabled is chosen, reference is now made to the exemplary arrangement of FIG. 9A, in view of which, many other arrangements such as use of a look-up table alluded to above will be apparent to those skilled in the art. It should be understood that the illustration provided in FIG. 9A is intended to convey the basic operational principles of the invention at a relatively high level of abstraction to represent all of the variant techniques of control of the $T_{start}$ delay and details of low importance to the successful practice of the invention or evident to those skilled in the art have been omitted from FIG. 9A in the interest of clarity.

It will be recognized that a substantial portion of the arrangement illustrated in FIG. 9A has been illustrated in FIGS. 6B and 7A and discussed above in connection therewith, particularly in regard to gate driver 70 and power transistor drivers 72, the latter being labeled as $72_{m-1}$ and $72_m$ in FIG. 9A to indicate that they simply correspond to an arbitrary consecutive pair of power transistors in a potentially much larger array.

Figure 9B:
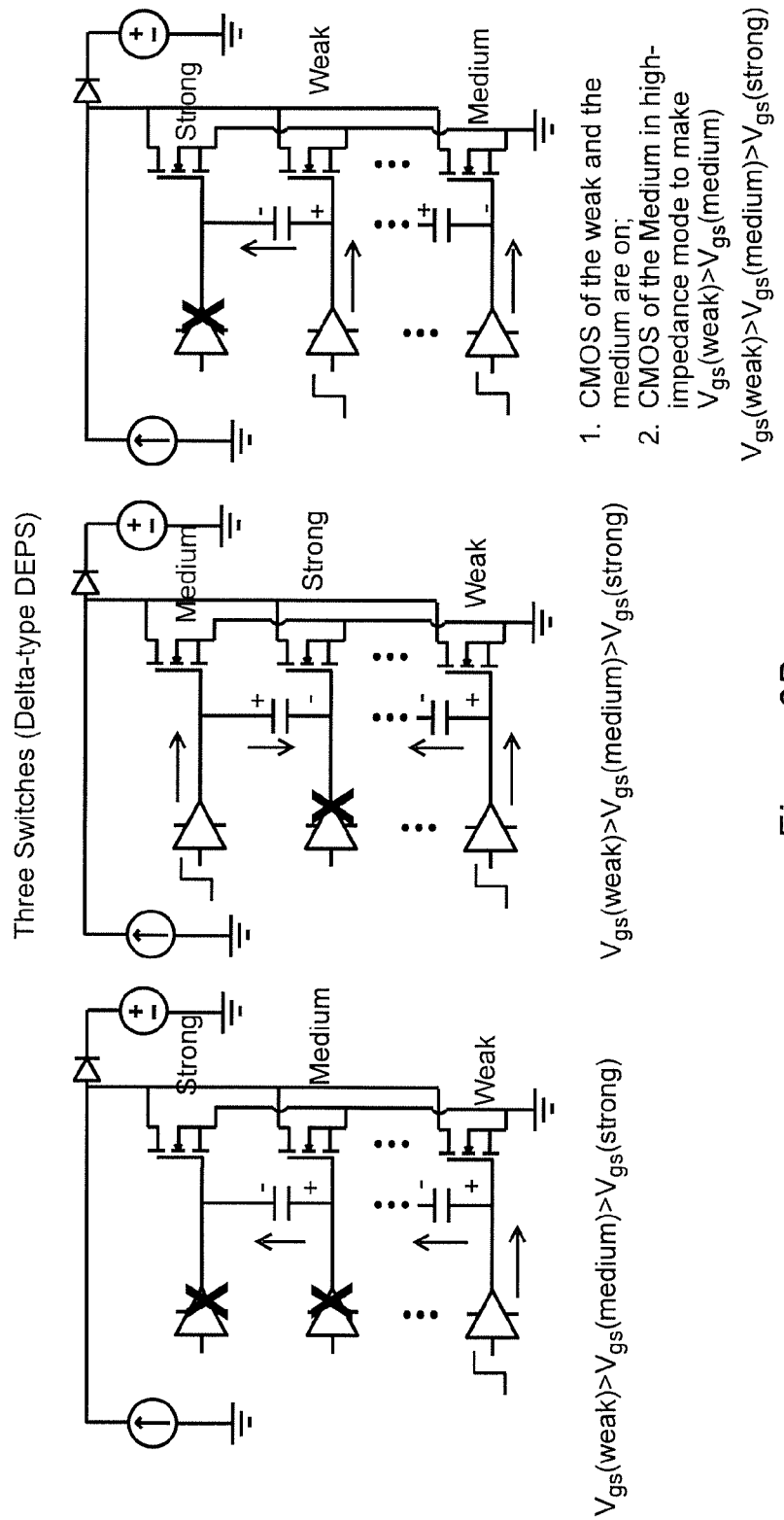
Figure 9C:
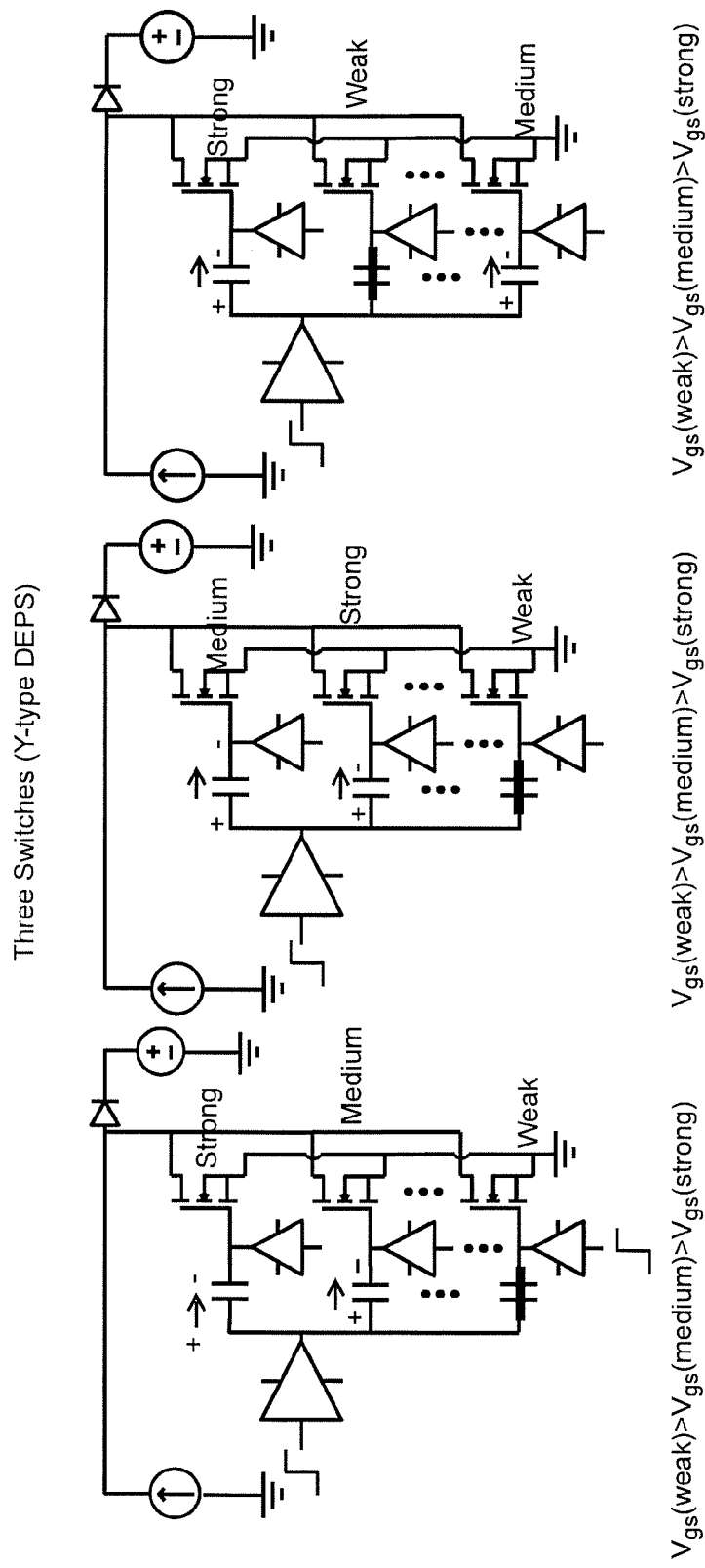

In FIG. 9A, comparators in dashed line boxes 91 and 92 both receive the outputs of sensors for chosen operating parameters for the respective power transistors. These sensors are drawn as current sensors 93 and 94 for convenience but any other sensor appropriate to one or more parameters of interest could be employed. The comparator 91 is connected in a manner to have an analog output of the absolute value of the magnitude of the difference of the parameters sensed by the respective sensors 93, 94 while comparator 92 is connected to have a digital output at either of two logic state voltages. Thus comparator 91 determines the magnitude of imbalance of the respective parameters and provides an output to a threshold comparator and/or delay generator 95. An output of threshold comparator and/or delay generator 95 is used to enable comparator 92 which will provide a high or low logic level output voltage depending on which of the outputs of sensors 93, 94 is greater. The logic level output of comparator 92 is then fed back to power transistor driver $72_{m-1}$ directly and fed back to power transistor driver $72_m$ through an inverter or NOT gate 96 to disable one of the power transistor drivers 72 after a delay corresponding to a $T_{start}$ delay that will develop a suitable voltage on the compensation capacitor $C_{comp}$ that will tend to equalize the conduction characteristics or other performance parameters of the power transistors. Thus, when more than two parallel-connected power transistors are employed in a high current power switch, the drivers 72 of the power transistors are disabled in the order of strength of conduction of the associated power transistor as shown in FIGS. 9B and 9C for delta and Y compensation capacitor connections, respectively.

The control strategy and methodology is very similar for the Y-connection of capacitors. As alluded to above in connection with FIG. 5B, the compensation or equalization capacitors simply form capacitive voltage dividers between gate terminals of power transistors with one terminal of each capacitor connected to a common node which will become charged to a voltage common to all of the power transistors with different voltages being built up on the capacitor directly connected to each respective power transistor which are charged in the same fashion by sensing a difference between a chosen parameter for each power transistor and disabling an appropriate driver at an appropriate time. Compensation capacitors can be bypassed by enabling sub-drivers 72 directly connected to the gate terminals. Thus, while $T_{start}$ times and compensation/equalization voltages will be different from those appropriate to the delta connection, the basic principles of the control strategy and methodology will be the same for both delta and Y capacitor connection configurations.

Figure 10:
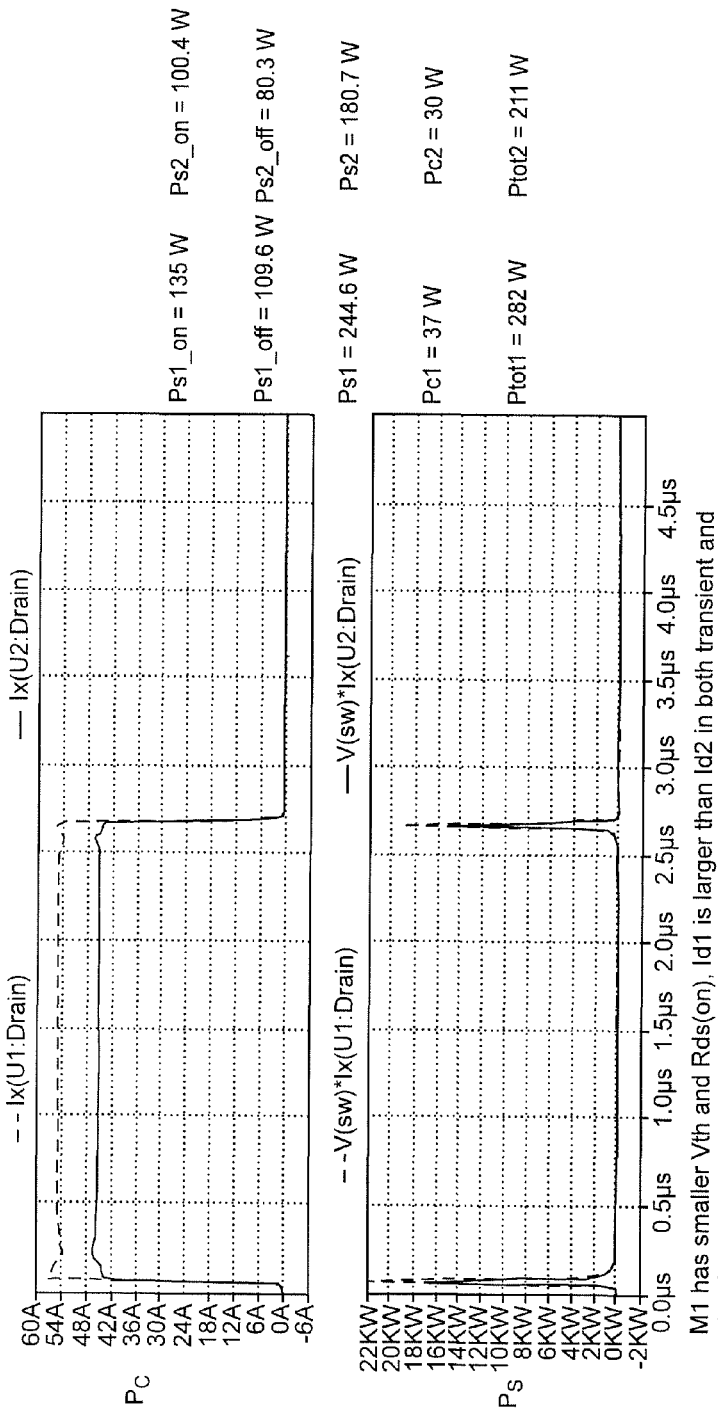
FIGS. 10, 11 and 12 illustrate variant strategies for equalizing switches and conduction losses, and FIGS. 13A and 13B provide a comparison of power switch performance without and with the invention which confirms the effectiveness of the invention to achieve power switch current and/or temperature equalization.

In the interest of completeness, some variations of the control strategy can be achieved without departing from the basic principles of the invention as will now be discussed in connection with FIGS. 10-12. FIG. 10 illustrates and lists measurements of salient parameters of two exemplary but representative transistors, M1 and M2. In this case, M1 exhibits smaller $V_{th}$ and $R_{ds(on)}$ and Id1 is larger than Id2 in both transient and steady-state. Switching losses for M1 and M2 are denoted by Ps1 and Ps2, respectively, and may differ between turn-on and turn-off transients denoted by Ps1_on and Ps1_off, Ps2_on and Ps2_off. Conduction losses for M1 and M2 are denoted by Pc1 and Pc2, respectively. Thus total power losses for M1 and M2 are denoted by Ptot1 and Ptot2, respectively.

As alluded to above, while small capacitors are preferred for rapid response time and high frequency operation, neither the capacitance value of the equalization/compensation capacitor(s) nor the voltage developed thereon is critical and, within limits imposed by a particular application, can be varied substantially. It should also be apparent from the foregoing that, to a degree, both switching losses and conduction losses can be independently controlled and provide two somewhat different ways of balancing total losses among power switches.

More specifically, FIG. 10 shows respective currents in the upper graph and power losses in the lower graph for two unbalanced power transistors, M1 and M2. The numerical values of the respective losses are listed to the right of the waveforms of FIG. 10 and it can be seen that the total power losses, Ptot1 and Ptot2, of M1 and M2 are quite different at 282 watts and 211 watts, respectively. To balance the total losses, the conduction and switching losses can be made to compensate for each other being altered in a complementary fashion as depicted in FIG. 11 or made substantially equal as depicted in FIG. 12 by adjustment of the capacitance of $C_{21}$ and $T_{start}$.

Figure 11:
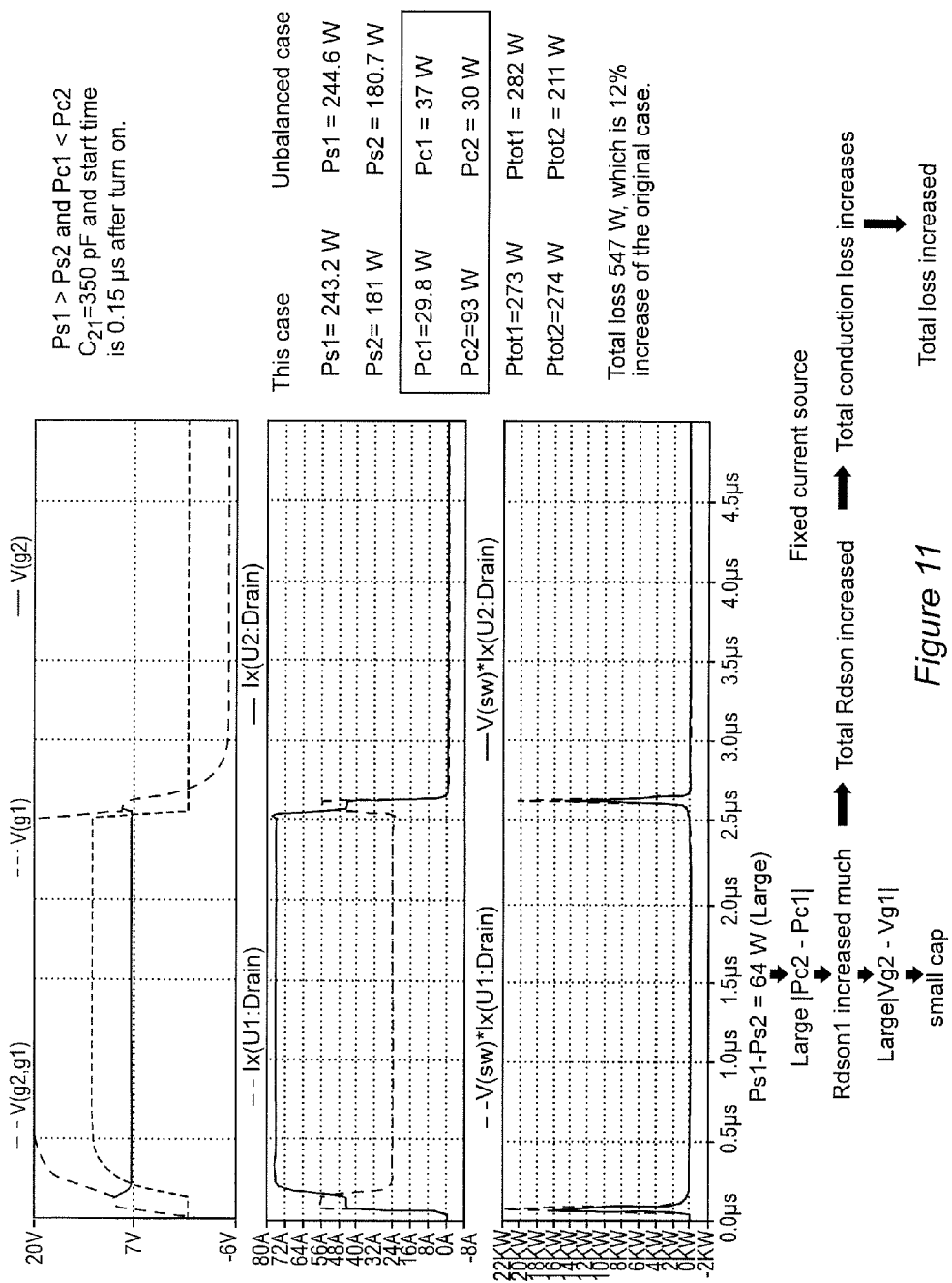

In the example illustrated in FIG. 11, a small capacitance value of $C_{21}$=350 pF and a start time, $T_{start}$=0.15 μsec after turn-on are assumed. The upper graph depicts the waveforms of $V_{gs}1$, $V_{gs}2$ and $V_{c21}$. The middle graph depicts the drain currents of M1 and M2 and the lower graph depicts the power losses of M1 and M2. The peaks evident in the lower graph are switching losses. (The same parameters are depicted in the three graphs of FIG. 12.) As depicted in the lower portion of FIG. 11, since the difference in switching losses is large, a large difference in conduction losses is required to balance the power losses between M1 and M2. Conduction loss is related to the ON-resistance of the respective transistors. Thus, balancing of total power losses can be performed by decreasing the ON-resistance, $R_{dson}$, of one transistor, which is not generally possible, or increasing the ON-resistance of the other transistor to create a difference in conduction loss. To achieve a sufficiently large difference in $R_{dson}$, a sufficiently large difference in $V_{gs}$ is required in steady-state to cause a difference in conduction loss. $C_{21}$ is small and the start time begins very shortly after the beginning of the turn-on period consistent with the voltage developed on $C_{21}$ being large to substantially increase $R_{dson1}$ of transistor M1 to balance Ptot1 and Ptot2 within one watt or approximately 0.3%.

It should be noted that, because the two transistors M1 and M2 are connected in parallel, increasing the $R_{dson}$ of M1, as shown in the dashed box to the right of the graphs in FIG. 11, increases the total $R_{dson}$ and significantly increases the total conduction loss. (The changes in switching losses are very slight due to the start time occurring after the transient period during which $I_d$ is increasing and $V_{ds}$ is decreasing.) The total losses of both power transistors is 547 watts or a 12% increase over the total power losses of the original unbalanced transistors. In general, the approach to compensating differences in switching losses by alteration of current losses requires greater power losses to be incurred than the alternate approach of equalizing both switching losses and conduction losses as will now be discussed in connection with FIG. 12.

Figure 12:
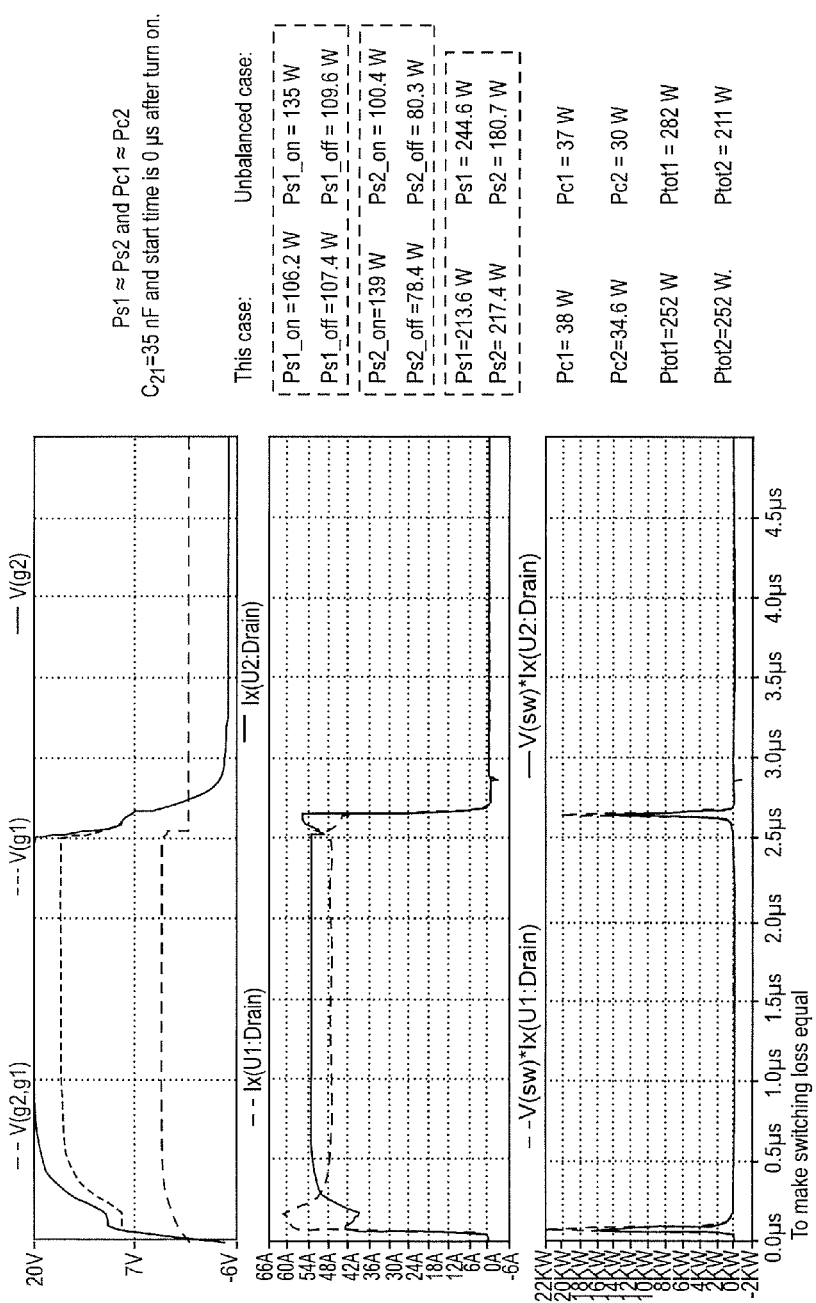

In the example illustrated in FIG. 12, $C_{21}$ has a much larger value of 35 nF and $T_{start}$ and $T_0$ are simultaneous. The effect of the longer charging time is evident and principally alters the switching losses to make the switching losses approximately equal while obtaining some additional compensation in the conduction losses. To do so, $V_{g1}$ can be maintained at a level less than $V_{g2}$ during almost the entire turn-on period. $V_{g1}$ will be substantially equal to $V_{g2}$ throughout most of the turn-off period and the change in turn-off losses of both transistors is very slight. Also, since conduction losses are larger in M1 than in M2, $V_{g1}$ should be less than $V_{g2}$ throughout the conduction period, a condition which is consistent with the conditions during the turn-on period. Thus, equalization of power losses can be made substantially exact with only a total power loss increase of about 3% or about one-fourth of the power loss increase of the equalization approach discussed above in connection with FIG. 11.

Figure 13A:
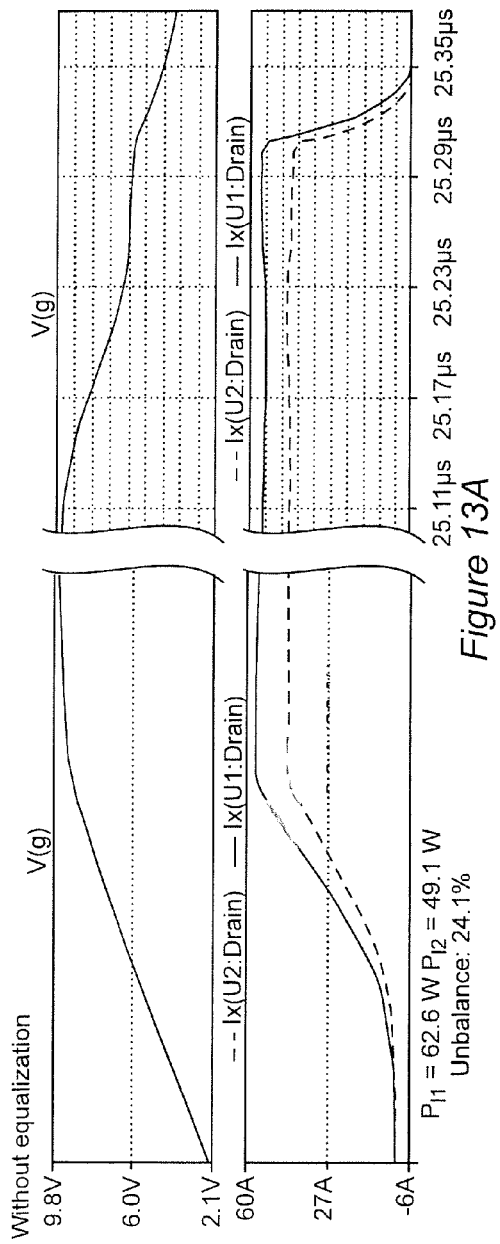
Figure 13B:
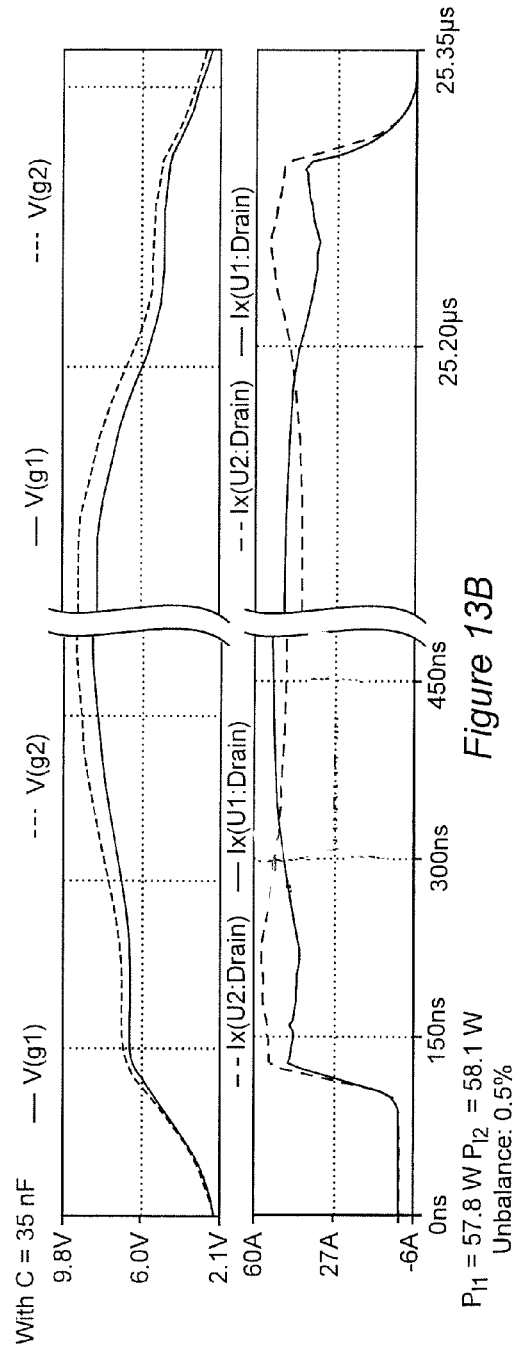

Referring now to FIGS. 13A and 13B, the efficacy of the present invention to equalize operational performance between parallel-connected power transistors is graphically illustrated. The time periods depicted are the turn-on and turn-off transients including a portion of the steady-state operation in the center with section markings indicating the omission of a portion of the steady-state operation of arbitrary length. In FIG. 13A the upper trace is the gate voltage on a pair of power transistors without the compensation provided by the invention. Accordingly, the control voltages are the same and only one trace is shown while the lower traces clearly show that one power transistor is conducting substantially more strongly than the other. The power imbalance in this example is 24.1%. In FIG. 13B, depicting the effects of the compensation provided by the invention, two upper voltage traces are observed reflecting the difference in control voltages developed on $C_{comp}$ (e.g. corresponding to $C_{21}$). The lower current traces are illustrated very much more closely together even though the vertical scale is somewhat expanded and the current levels of the two transistors actually cross due to compensation in the manner discussed above in connection with FIG. 12 in which it is sought to make conduction and switching losses equal. The power imbalance in this case (and for the same two power transistors) has been brought within 0.5%.

In view of the foregoing, it is clearly seen that the invention provides a driving arrangement for parallel-connected power transistors that is capable of automatically adjusting the control waveform from a single gate driver common to all power transistors for each power transistor to equalize operating parameters such as current, power loss and temperature within a very small tolerance. Moreover, the invention can be applied to any number of parallel-connected power transistors without significant increase in complexity since the same control arrangement is applied to each power transistor or pair of power transistors.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A power switch comprising,
   a plurality of power transistors, each having conduction terminals connected in parallel and a plurality of capacitors connected between control terminals of said plurality of power transistors,
   a power transistor driver for each of said power transistors,
   a gate driver for controlling said power transistor drivers,
   a plurality of sensors for sensing an operational parameter of each said power transistor, and
   a circuit responsive to each of said plurality of sensors for disabling respective ones of said power transistor drivers to assume a high impedance state such that respective ones of said plurality of capacitors are charged to a voltage that equalizes said operational parameter of each of said plurality of power transistors.

2. The power switch as recited in claim 1, wherein said plurality of capacitors are connected to said power transistors in a delta configuration.

3. The power switch as recited in claim 1, wherein said plurality of capacitors are connected to said power transistors in a Y configuration.

4. The power switch as recited in claim 1, wherein said plurality of sensors measure said operational parameter during steady-state operation.

5. The power switch as recited in claim 4, wherein said operational parameter is temperature.

6. The power switch as recited in claim 4, wherein said operational parameter is current.

7. The power switch as recited in claim 1, wherein said operational parameter is temperature.

8. The power switch as recited in claim 1, wherein said operational parameter is current.

9. The power switch as recited in claim 1, wherein said power transistors are Silicon Carbide MOSFETs.

10. Apparatus for equalizing an operational parameter in a plurality of power transistors, each of said plurality of power transistors having conduction terminals connected in parallel, said apparatus comprising;
   a plurality of capacitors connected between control terminals of said plurality of power transistors,
   a power transistor driver for each of said power transistors,
   a gate driver for controlling said power transistor drivers,
   a plurality of sensors for sensing an operational parameter of each said power transistor, and
   a circuit responsive to each of said plurality of sensors for disabling respective ones of said power transistor drivers to assume a high impedance state such that respective ones of said plurality of capacitors are charged to a voltage that equalizes said operational parameter of each of said plurality of power transistors.

11. Apparatus as recited in claim 10, wherein said plurality of capacitors are connected to said power transistors in a delta configuration.

12. Apparatus as recited in claim 10, wherein said plurality of capacitors are connected to said power transistors in a Y configuration.

13. Apparatus as recited in claim 10, wherein said plurality of sensors measure said operational parameter during steady-state operation.

14. Apparatus as recited in claim 13, wherein said operational parameter is temperature.

15. Apparatus as recited in claim 13, wherein said operational parameter is current.

16. Apparatus as recited in claim 10, wherein said operational parameter is temperature.

17. Apparatus as recited in claim 10, wherein said operational parameter is current.

18. A method of equalizing power losses in each of a plurality of power transistors having conduction terminals connected in parallel, said method comprising steps of;

charging a gate terminal of each said power transistor with an output of a driver circuit having a high impedance output when disabled, diverting current from said output of said driver circuit to a capacitor connected to a gate terminal of one power transistor by disabling a driver circuit of another power transistor to which said capacitor is also connected, and determining a time to disable said driver circuit of said another power transistor such that charge on said capacitor alters conduction of said another power transistor.

19. The method as recited in claim 18, wherein said charge on said capacitor alters conduction of said another power transistor such that differences in switching losses and conduction losses in said another power transistor are altered in a complementary manner.

20. The method as recited in claim 18, wherein said charge on said capacitor alters conduction of said another power transistor such that differences in switching losses and conduction losses in said another power transistor are made equal to switching losses and conduction losses in said power transistor.

* * * * *